(12) United States Patent
Onishi et al.

(10) Patent No.: US 6,198,273 B1
(45) Date of Patent: Mar. 6, 2001

(54) IC TESTER SIMULTANEOUSLY TESTING PLURAL ICS

(75) Inventors: Takeshi Onishi, Gyoda; Minoru Yatsuda, Fukaya; Katsuhiko Suzuki, Oura-gun, all of (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 08/966,781

(22) Filed: Nov. 10, 1997

(30) Foreign Application Priority Data

Nov. 12, 1996 (JP) .................................................. 8-300486

(51) Int. Cl.⁷ .............................. G01R 1/04; G01R 31/02; B65B 21/02; G01D 3/00
(52) U.S. Cl. ...................... 324/158.1; 324/754; 414/403; 702/108
(58) Field of Search .............................. 324/158.1, 754, 324/760, 73.1, 755; 702/108, 117; 414/403, 404, 416, 405, 409; 209/571, 573, 574, 538

(56) References Cited

U.S. PATENT DOCUMENTS

| | | | |
|---|---|---|---|
| 5,180,975 | * | 1/1993 | Andoh et al. ...................... 324/158.1 |
| 5,307,011 | * | 4/1994 | Tani ................................... 324/158.1 |
| 5,313,156 | * | 5/1994 | Klug et al. ........................ 324/158.1 |
| 5,319,353 | * | 6/1994 | Onishi et al. ......................... 209/571 |
| 5,530,370 | * | 6/1996 | Langhof et al. ...................... 324/754 |
| 5,590,137 | * | 12/1996 | Yamashita ......................... 324/158.1 |
| 5,742,168 | * | 4/1998 | Kiyokawa et al. ................... 324/754 |
| 5,788,084 | * | 8/1998 | Onishi et al. ...................... 324/158.1 |
| 5,865,319 | * | 2/1999 | Okuda et al. ......................... 209/574 |
| 5,909,657 | * | 6/1999 | Onishi et al. ......................... 702/108 |
| 5,986,447 | * | 11/1999 | Hanners et al. .................. 324/158.1 |

FOREIGN PATENT DOCUMENTS 63-3280   1/1988  (JP) .
3-221881  9/1991  (JP) .

* cited by examiner

*Primary Examiner*—Safet Metjahic
*Assistant Examiner*—Jermele M. Hollington
(74) *Attorney, Agent, or Firm*—Staas & Halsey LLP

(57) ABSTRACT

In an integrated-circuit tester which is provided with a contact failure analysis/storage part for counting and storing the number of failures occurring at each contact, an automatic stop part for deciding contact as defective based on the numbers of failures stored in the storage part and for stopping a handler, an automatic turn-OFF part by which, upon each operation of the automatic stop part, contacts having met the stop condition are automatically put in their unused state, and a defective contact display for displaying the number of contacts put in the unused state upon each automatic stop of the handler, an operator checks the number of contacts put in the unused state upon each automatic stop of the handler, then decides whether or not all the contacts used are to be replaced, and performs the necessary operations for resuming the test.

7 Claims, 8 Drawing Sheets

FIG. 7

22 MODE SETTING (1) AUTO STOP :                    ☒ VALID
                                   ☐ INVALID (2) CONTACT AUTO-OFF :             ☐ AUTO-OFF
                                   ☒ ALARM/STOP (3) CONTACT-OFF MODE :             ☒ CONTINUOUS
                                   ☐ EACH LOT (4) FAIL CATEGORY CHECK            ☒ INVALID
    AT RETESTING :                 ☐ VALID (5) YIELD SETTING MODE :           ☒ INDIVIDUAL
                                   ☐ RELATIVE (6) YIELD SETTING
        NUMBER SETTING :    10
        FAIL RATE :         10%

(7)         ┌─────────────────────────────┐
            │  FAILURE CONTACT DISPLAY    │
            └─────────────────────────────┘
                            │
                           31

IC TESTER SIMULTANEOUSLY TESTING PLURAL ICS

BACKGROUND OF THE INVENTION

1. Field of the Invention

The present invention relates to an integrated-circuit tester for testing ICs (semiconductor integrated circuit elements) for defects and, more particularly, to an IC tester of the type that does simultaneous testing of plural ICs.

2. Background of the Related Art

With reference to FIGS. 1 through 5, a description will be given, in particular, of the general construction of what is called a handler which automatically transfers ICs in an IC tester for testing a number of ICs at one time. FIG. 1 is a plan view schematically showing the handler in the form of functional blocks. Reference numeral 100 denotes a chamber section with a tester head placed therein, 200 an IC storage section for housing not-yet-tested ICs and for housing tested ICs according to their test results, 300 a loader section for loading the not-yet-tested ICs into the chamber section 100, 400 an unloader section for unloading tested ICs from the chamber section 100 while sorting them out according to their test results, and TST test trays. The not-yet-tested ICs are loaded on the test trays TST in the loader section 300 and brought into the chamber section 100, and after being tested therein, they are brought out therefrom and into the unloader section 400.

The chamber section 100 comprises a constant temperature chamber wherein the ICs loaded on the test trays TST undergo an intended high or low-temperature thermal stress, a test chamber 102 wherein the ICs thus thermally stressed in the constant temperature chamber 101 are held in contact with a tester head 104 during testing, and a cooling/heating chamber 103 for removing the thermal stress from the ICs tested in the test chamber 102. When the ICs are heated at a high temperature in the constant temperature chamber 101, they are cooled down to room temperature by an air blow in the cooling/heating chamber 103 after the test in the test chamber 102 and then carried out therefrom to the unloader section 400. When the ICs are cooled down to a low temperature as of −30° C. or so prior to the test, they are heated by hot air or heater in the cooling/heating chamber 103 up to a temperature at which substantially no condensation occurs, and then the tested ICs are carried out to the unloader section 400.

The constant temperature chamber 101 and the cooling/heating chamber 103 are disposed upwardly of the test chamber 102. Extended between the upper portions of the constant temperature chamber 101 and the cooling/heating chamber 103 as shown in FIG. 2 is a mounting plate 105, on which a test tray transfer unit 108 is mounted so that the test trays TST are transferred from the cooling/heating chamber 103 side to the constant temperature chamber 101. The test trays TST are loaded with not-yet-tested ICs in the loader section 300 and carried into the constant temperature chamber 101. In the constant temperature chamber 101 there is placed a vertical transfer unit, by which plural test trays are supported in the wait state until the test chamber 102 becomes empty. During waiting the ICs are subjected to high- or low-temperature thermal stress. In the test chamber 102 there is placed centrally thereof a tester head 104, with which the ICs on the test tray TST brought to the position just above it are electrically connected for test. After the test the test tray TST is carried out of the test chamber 102 and into the cooling/heating chamber 103 for cooling the ICs down to room temperature, thereafter being discharged into the unloader section 400.

As depicted in FIGS. 1 and 2, the IC storage section 200 has a yet-to-be untested IC stocker 201 for housing ICs to be tested and a tested IC stocker 202 for housing ICs sorted out according to their test results. In the yet-to-be untested IC stocker 201 universal trays KST carrying the ICs to be tested are stacked on top of each other in layers. The universal trays KST are brought to the loader section 300, wherein the ICs on the universal trays KST are reloaded therefrom onto the test tray TST at a standstill in the loader section 300. To reload the ICs from the universal tray KST onto the test tray TST in the loader section 300, it is possible to employ an X-Y transfer unit 304 which comprises, as shown in FIG. 2, two rails 301 planted on the mounting plate 105, a movable arm 302 mounted on the rails 301 in a manner to be movable to and fro between the test tray TST and the universal tray KST (in the direction assumed to be the Y direction in this specification), and a movable head 303 supported by the movable arm 302 and movable along it in the X direction. The movable head 303 has downward suction heads, which move while sucking air; hence, the ICs on the universal trays KST are sucked up therefrom by the suction heads and brought onto the test trays TST. The number of suction heads mounted on the movable head 303 is, for example, eight or so, by which eight ICs are transferred onto the test tray TST at one time.

FIG. 3 shows the construction of the test tray TST. The test tray TST has a rectangular frame 12, plural parallel crosspieces 13 placed thereacross at equal intervals and plural equally spaced mounting pieces 14 protrusively provided on the crosspieces 13 along their both marginal edges and on opposite sides 12a and 12b of the frame 12 along their inside marginal edges. Between the opposed crosspieces 13 and between them and the opposite sides 12a and 12b there are defined IC holder housing portions 15 each having two opposed mounting pieces 14. In each IC holder housing portion 15 there is housed one concave IC holder 16 molded of a resinous material, which is loosely secured by fasteners 17 to the two mounting pieces 14. The test trays TST each have about 16 by 4 IC holders 16 mounted thereon.

The IC holders 16 are all identical in shape and in size and each receives an IC in its concavity 19. The concavity 19 is determined according to the shape of the IC to be received therein. That is, the IC holder 16 is prepared for each shape of the IC and changed according to the IC configuration. To this end, each IC holder 16 has holes hl for affixing it to the mounting pieces 14 and positioning pin receiving holes h2 made in its opposite end portions.

As shown in FIG. 4, the IC holder 16 receives and holds therein the IC with its pins 18 extending downward for contact with the tester head 104. The IC pins 18 are pressed against contacts 19 of an IC socket to establish electric connections between the IC and the tester head 104. To perform this, a presser 20 is disposed above the tester head 104, by which the IC received in the IC holder 16 is pressed down into contact with the tester head 104.

For example, as depicted in FIG. 5, ICs are arrayed in the test tray TST with 4 rows and 16 columns and the ICs of every fourth columns (indicated by diagonal shading) are connected to the tester head 104 or tested at one time. In the first round of test, 16 ICs of columns 1, 5, 9 and 13 are connected to the tester head 104, then in the second round the test tray TST is shifted by one column and 16 ICs of columns 2, 6, 10 and 14 are tested; this operation is repeated four times to test all the ICs mounted on the test tray TST. The test results are stored at addresses that are determined, for example, by identification numbers given to the test tray TST and the numbers of the IC holders 16 assigned thereto in the test tray TST.

The test results are used as data to sort out non-defectives from defectives when the tested ICs are transferred from the test tray TST to the universal tray KST in the unloader section 400. This data is erased upon completion of the above assortment. Conventionally, the number of failures of ICs tested so far through the contact of the respective IC socket of the tester head 104 (which contact refers to the whole set of contacts of each IC socket) is stored in one of storage areas which have a one-to-one correspondence with the contacts of individual IC sockets; when the number of failures in any storage area exceeds a predetermined number, an alarm is raised and the handler is automatically stopped and, at the same time, on the assumption that the contact in question is malfunctioning, an instruction is issued to inhibit subsequent loading of ICs in the IC holder 16 at the position corresponding to that contact.

When failures concentrates on a particular contact, the handler is automatically stopped from operation, while at the same time an alarm is issued to inform an operator of the abnormality, urging him to check the contacts of all IC sockets. If no abnormality is found in the contacts, then the operator has to perform manipulations for resuming the operation of the IC tester. That is, the operator is required to carry out work for calling off the alarm, for tuning off the automatic stop mechanism and for turning on a restart switch.

In the other hand, when it is decided that the contact, at which failures have abnormally occurred, is malfunctioning, the operator performs manipulations for resuming the operation of the IC tester after inputting via a keyboard an instruction to inhibit subsequent feeding of ICs to the malfunctioning contact.

As described above, once the handler is automatically stopped due to the contact malfunction, the operator is required to do many tasks prior to restarting the operation of the IC tester; since the work for setting the failing contact in the unused state is particularly cumbersome, the operator's workload is heavy. In particular, simultaneous operation of many IC testers increases the operator's workload.

Such a heavy operator's workload could be reduced by the use of a control method that automatically sets the failed contact in the unused state without automatically stopping the operation of the handler.

This control method reduces the operator's workload, but the handler automatically sets the contact in the unused state, so that even if most of the contacts in the tester head 104 are in the unused state, nothing makes the operator aware of it and the test continues under inefficient circumstances.

SUMMARY OF THE INVENTION

It is therefore an object of the present invention to provide an IC tester that decreases the number of manipulations required after automatic stopping of the handler and hence reduces the operator's workload and that enables the operator to accurately judge the time when to replace the contacts with new ones.

According to the present invention, when the frequency of occurrence of IC failures is high at a particular contact, an alarm is raised and the handler is automatically stopped. At the same time, the contact concerned is automatically put in the unused state, so that the operator's workload is reduced accordingly. Furthermore, the number of contacts put in the unused state is displayed for visual recognition.

To resume the operation of the IC tester, the operator needs only to turn off the automatic stop mechanism, call off the alarm and manipulate the start-up mechanism after checking all the contacts of the IC sockets.

Hence, according to the present invention, since the handler once automatically stops, the operator is enabled to inspect the contacts of the IC sockets and recognize the number of contacts put in the unused state. Thereafter, the operator needs only to reset the automatic stop mechanism, call off the alarm and carry out the restart manipulation to resume the operation of the IC tester.

Thus, the present invention improves the operability of the IC tester while at the same time obviating the defect of resuming its operation even though the contacts are mostly put in the unused state.

BRIEF DESCRIPTION OF THE DRAWINGS

FIG. 7 is a diagram showing an example of a mode setting display screen for use in the embodiment of FIG. 6;

DETAILED DESCRIPTION OF THE PREFERRED EMBODIMENTS

Figure 1:
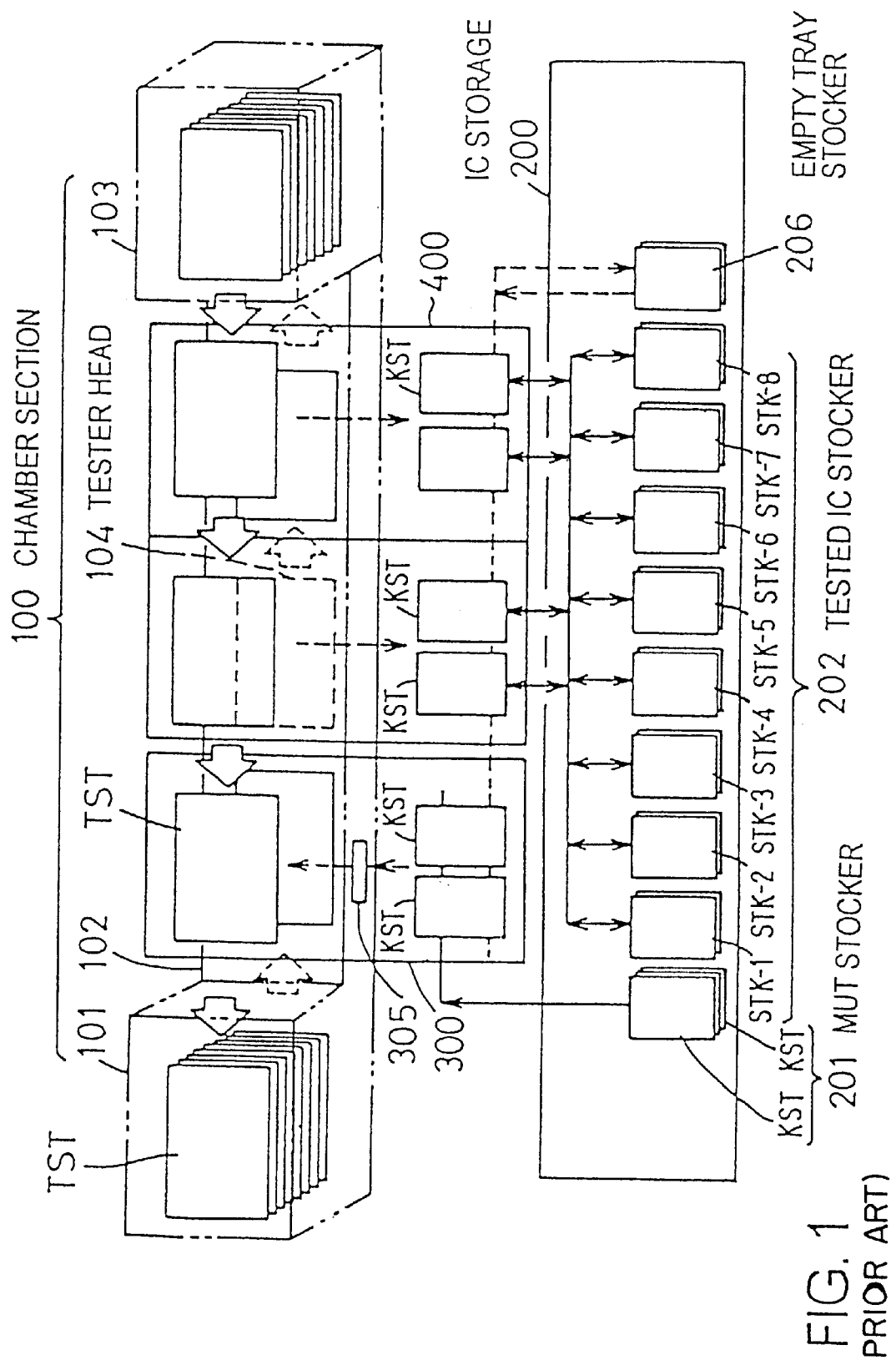
FIG. 1 is a schematic plan view for explaining an example of an IC tester capable of testing a number of Ics at the same time.
Figure 2:
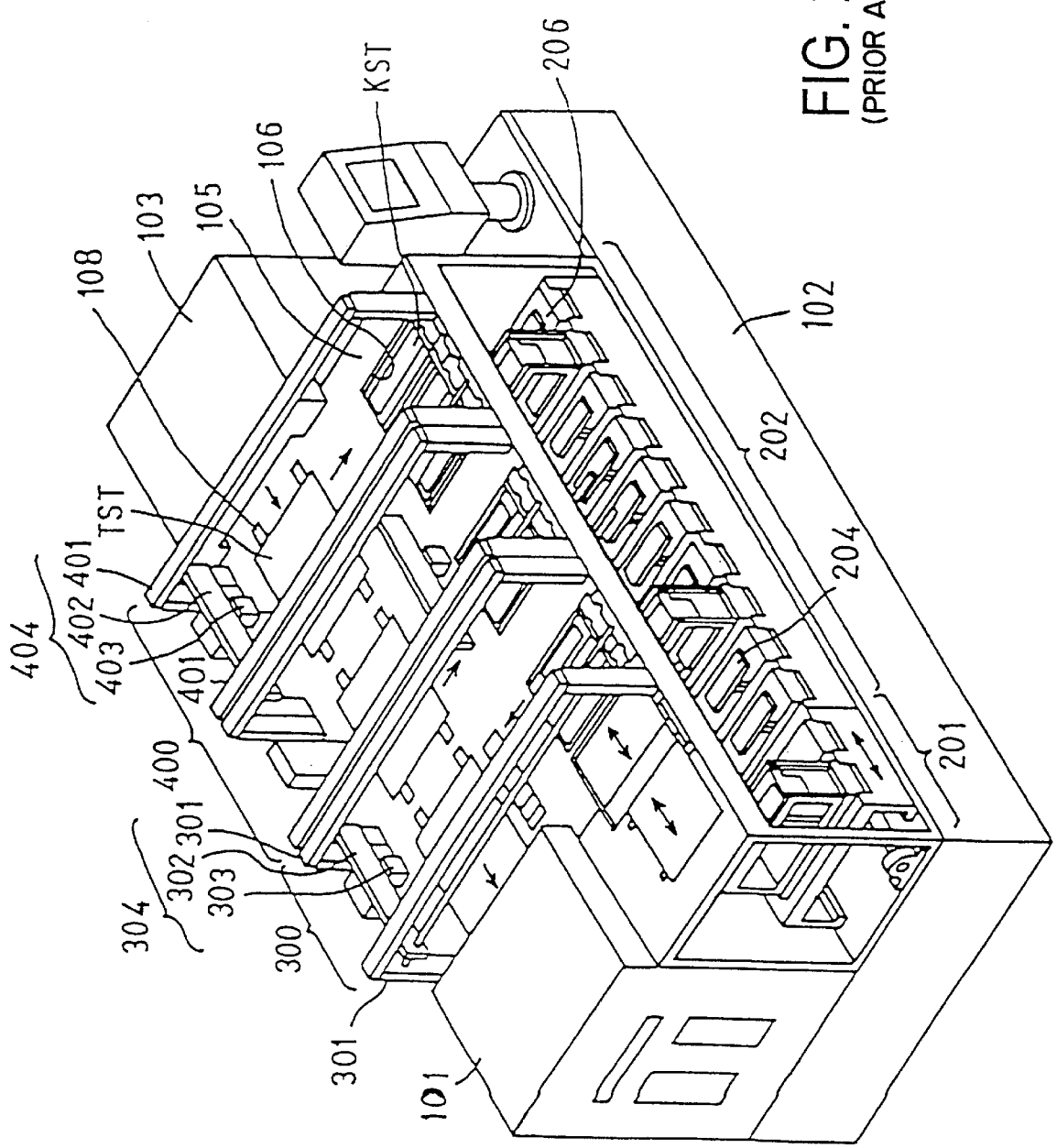
FIG. 2 is a perspective view of the IC tester of FIG. 1.
Figure 3:
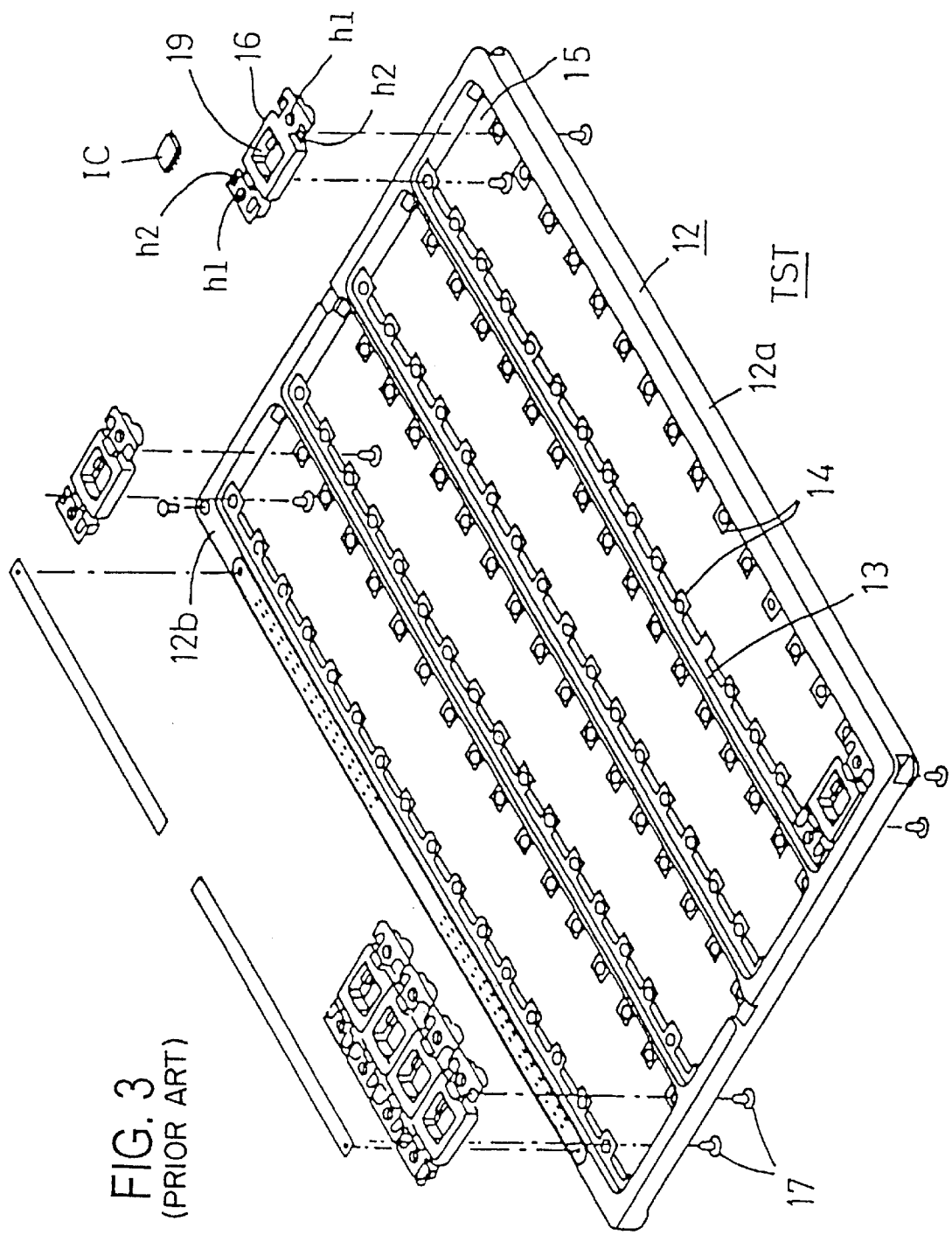
FIG. 3 is an exploded perspective view for explaining the construction of a test tray for use in the IC tester shown in FIGS. 1 and 2.
Figures 4, 5:
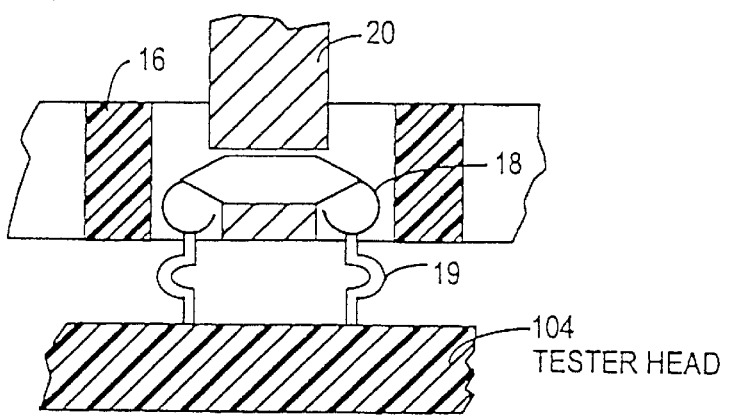
FIG. 4 is a sectional view for explaining the relationship between an IC mounted on the test tray of FIG. 3 and contacts of a tester head.
FIG. 5 is a plan view for explaining the procedure of testing ICs on the test tray.
Figure 6:
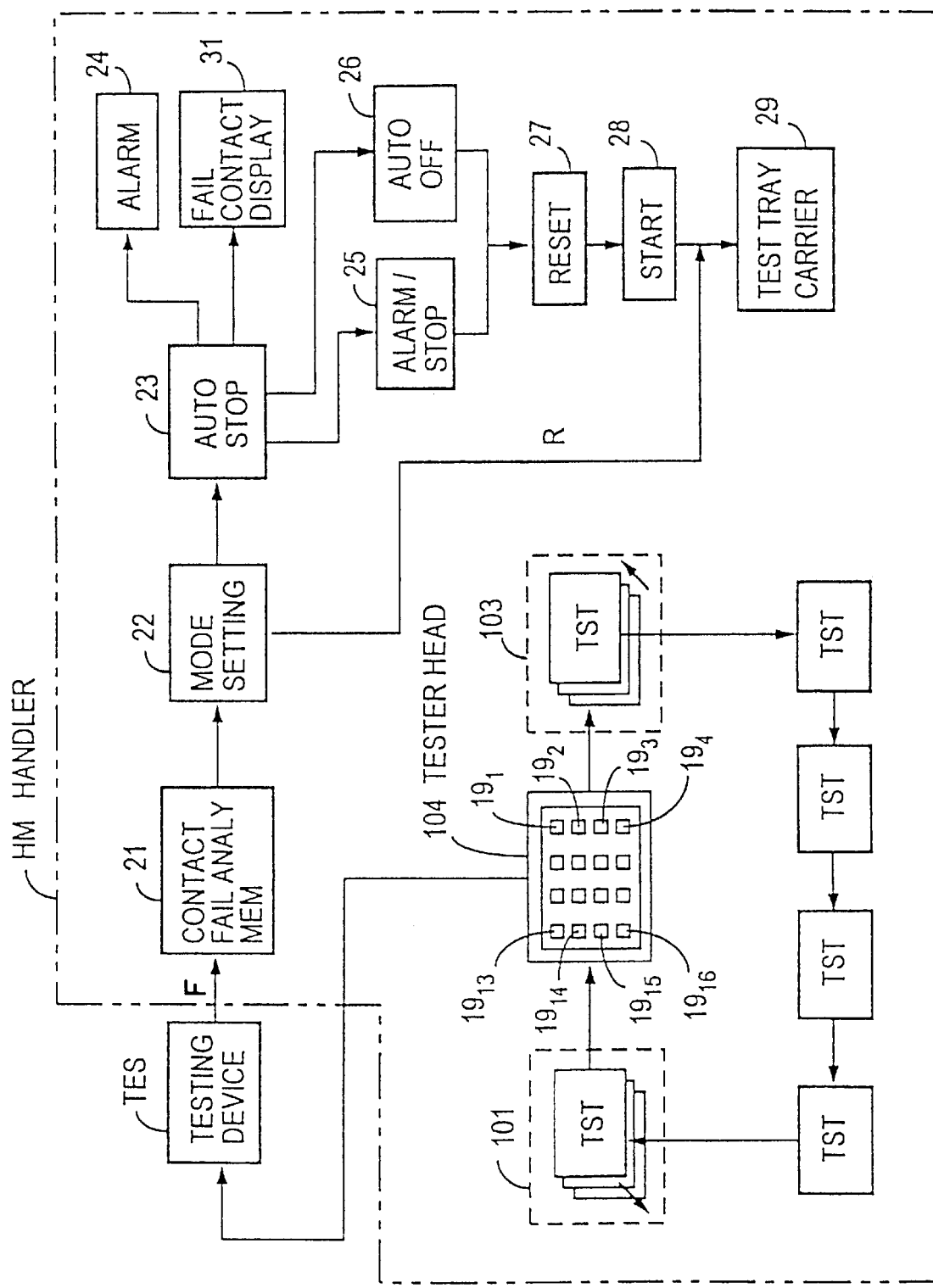
FIG. 6 is a block diagram illustrating an embodiment of the present invention.

FIG. 6 illustrates in block form an embodiment of the present invention, in which a handler HM for IC testing use is schematically shown by a transfer route of the test tray TST and signal processing functional blocks. In this embodiment the tester head 104 has 16 contacts $19_1$ to $19_{16}$ for simultaneous testing of 16 ICs. The contacts $19_1$ to $19_{16}$ are electrically connected to a testing device TES called a main frame.

The testing device TES has a test pattern generator, a logic comparator, a failure analysis memory and so forth, though not shown in particular. A test pattern signal from the test pattern generator is applied to the contacts $19_1$ to $19_{16}$, through which it is written in the 16 ICs (memories) held in contact with them. Read-out signals from the ICs are fed back to the testing device TES, wherein they are each compared by the logic comparator with an expected value for the occurrence of a mismatch to detect a failing address. And failing cell position information on the failing address is stored in the failure analysis memory, wherein it is analyzed to determine if failure recovery is possible, that is, if the IC is non-defective or defective.

According to the present invention, no matter which contact is detected failing, a failure detected signal F corresponding to that contact is sent from the testing device TES to the handler HM, wherein it is stored as a failure count value in that one of storage areas of a contact failure analysis/storage part 21 which corresponds to the failing contact. The contact failure analysis/storage part 21 is caused to make a check to determine whether to automatically stop the handler HM, in accordance with the number of failures for any contact stored in the contact failure analysis/storage part 21, and in the case where the handler HM automatically stopped, the contact that meets the condition for automatic stop of the handler HM is automatically put in unused state.

The contact failure analysis/storage part 21 has, though not shown, 16 storage areas in a one-to-one correspondence with the contacts $19_1$ to $19_{16}$ through which 16 ICs are simultaneously tested, and whenever the ICs tested through the contacts $19_1$ to $19_{16}$ are decided as defective, the failure count values stored in the corresponding storage areas are each updated by being incremented by 1.

In a mode setting part 22 valid and invalid modes are set in which to determine whether to automatically stop the handler EM according to the number of failures having occurred so far. When the invalid mode is set in the mode setting part 22, a start-up signal R is applied directly to a test tray transfer part 29 to put it in motion regardless of the number of failures, bringing out the test tray TST loaded with tested ICs from the test chamber 102 and into the cooling/heating chamber 102 and transferring the test tray TST loaded with ICs to be tested from the constant temperature chamber 101 into the test chamber 102.

When the valid mode is set, the mode setting part 22 conveys to an automatic stop part 23 the number of failures stored in the contact failure analysis/storage part 21 for each contact. The automatic stop part 23 has plural condition setting units, in which plural conditions for automatic stop are set. The stop conditions are such as listed below.

(a) When failures occur in succession at the same contact more than a predetermined number of times:

(b) When B % of A ICs tested through the same contact fails (A and B can be set at arbitrary values including zero):

(c) When the ratio, D/C, of the number D of Ics decided as defective to the total number C of ICs tested through all the contacts exceeds a predetermined value E.

The automatic stop part 23 allows to preselect any one of the above stop conditions (a), (b) and (c) and makes a decision on automatic stop of the handler HM based on the preselected condition. Also, the automatic stop part 23 allows to preselect to start either one of an alarm/stop part 25 that merely issues an alarm and stops the handler HM from operation, and an automatic turn-OFF part 26 that, when the handler EM automatically stops, automatically sets in the unused state the contact having met one of the automatic stop conditions. This selection can be preset in the mode setting part 22.

In the case of the alarm/stop part 25 being selected, the automatic stop part 23 actuate an alarm device 24 to issue an alarm and automatically stop the handler HM each time the preset one of the stop condition (a), (b) and (c) is satisfied. In this automatic stop mode, as is the case with the prior art, the operator manipulates an input part (not shown) to put the contact suspected of being defective in the unused state, then turns OFF or resets the automatic stop part 23 and the alarm device 24 through a resetting part 27, and restarts the handler HM through a start-up part 28.

On the other hand, in the case of the automatic turn-OFF part 26 being selected, when the preset one of the stop condition (a), (b), and (c) is satisfied, the automatic stop part 23 actuates the alarm device 24 to issue an alarm and automatically stops the handler HM through the alarm/stop part 25, while at the same time it actuates the automatic turn-OFF part 26 to automatically set in the unused state the contact having met the present one of the stop conditions (a), (b), and (c). At this time, a failing contact display 31 displays the numbers of the contacts set as being unused and the total number of the defective contacts.

If the number of contacts set in the unused state, displayed on the display 31, is greater half the total number of contacts, the operator decides that all the contacts $19_1$ to $19_{16}$ be changed, and replaces them all with new contacts together with their support plate.

When the number of contacts set in the unused state is not more than half the total number of contacts, the operator decides to continue testing without changing the contacts, then actuates the resetting part 27 to release the automatic stop part 23 from its stop condition and stop the alarm 24 from operation, and actuates the start-up part 28 to start up the handler HM and the test tray transfer part 29.

Hence, according to the present invention, when the handler automatically stops in accordance with predetermined one of the stop conditions, the contact satisfying the stop condition is automatically set in the unused state by the automatic turn-OFF part 26, so that the operator needs only to perform the resetting operation through the resetting part 27 and the restarting operation through the start-up part 28 and hence is completely free from the cumbersome task of setting failed contact in the unused state. This improves the operability of the IC tester and reduces the operator's workload. Besides, since the number of contacts set in the unused state is displayed on the failing contact display 31 upon each automatic stopping of the handler HM, the operator can easily decide whether to replace the contacts $19_1$ to $19_{16}$ with new ones.

The first row (1) in FIG. 7 shows an example of a mode setting screen of the mode setting part 22 in FIG. 6. The illustrated example shows the case of the valid mode being set. The automatic contact turn-OFF function in the second row (2) is a part through which it is set whether to select the alarm/stop part 25 or the automatic turn-OFF part 26. The illustrated example showing the case of the alarm/stop part 25 being selected.

The contact OFF mode in the third row (3) is a part through which it is set whether to hold the state of the contact failure analysis/storage part 21 unchanged or to reset its stored contents upon completion of the IC test for each lot. The illustrated example shows the case of the former being selected.

The failure category check for retest in the fourth row (4) is a part through which it is set whether to put the automatic stop part 23 in operation when retesting ICs decided as defective when once tested. The illustrated example shows the case of setting the automatic stop part 23 inoperative during the retest.

The yield setting mode in the fifth row (5) is a part through which it is set whether to select the stop condition (b) Or (c). The indication "Individual" means a mode in which to decide the stopping of the handler HM, for example, when 10% of 10 ICs tested through each contact are concluded as defective (the afore-mentioned stop condition (b)). The indication "Relative" means a mode in which to stop the handler HM when the ratio of the number of defectives to the total number of tested ICs exceeds a predetermined value at any contacts (the afore-mentioned stop condition (c)). The illustrated example shows the case of the "Individual" being selected.

The part [Yield setting] in the sixth row (6) is a part for setting the number A of ICs to be tested and the failure ratio B for use in the case of the stop condition (b). The illustrate example shows the case of setting A at 10 and B at 10%.

The block in the lowermost row (7) indicates the part of the failure contact display 31. In this block there are displayed the numbers of the contacts set in the unused state together with the number of unused contacts.

Figure 8:
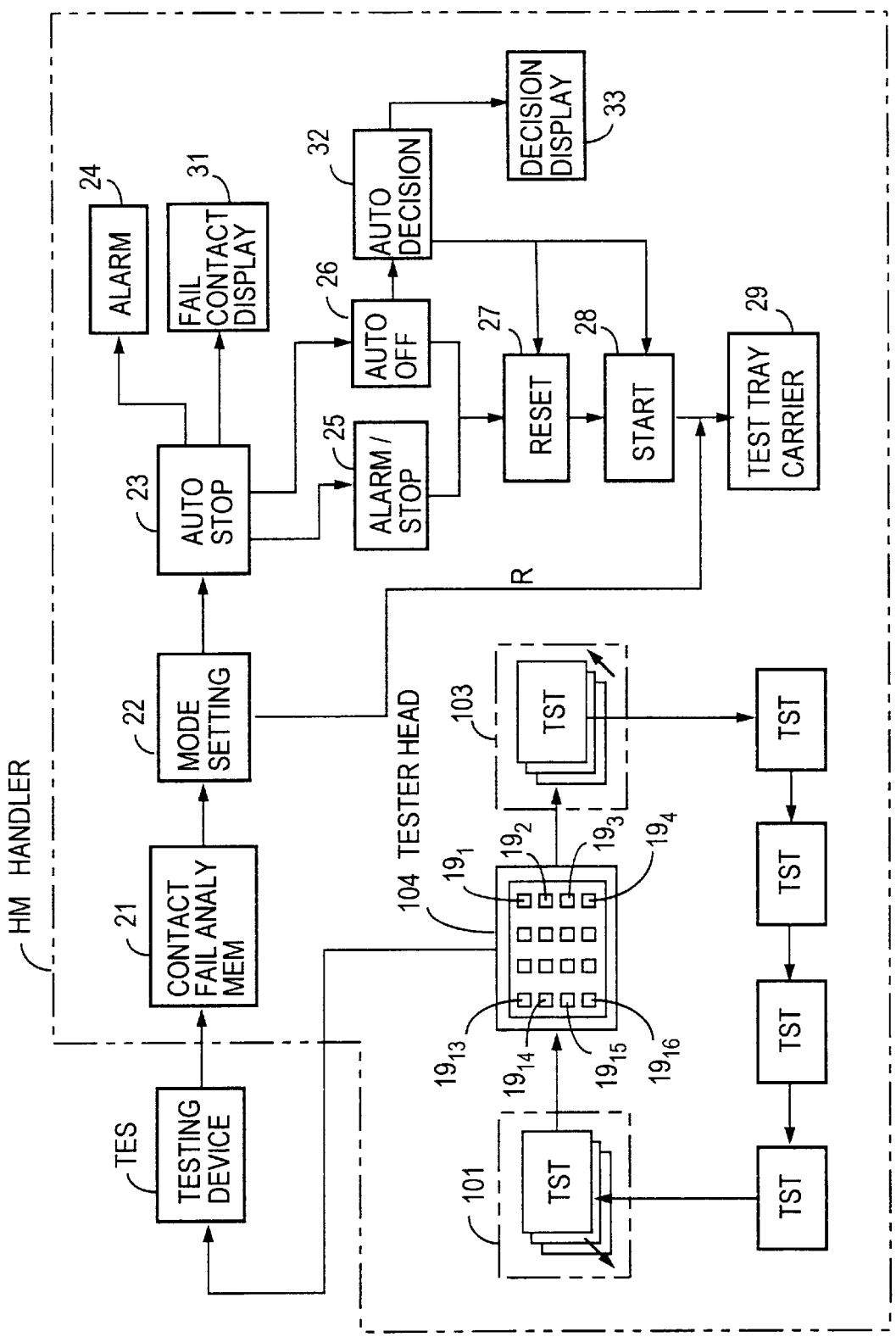
FIG. 8 is a block diagram illustrating another embodiment of the present invention.

FIG. 8 illustrates another embodiment of the present invention, which differs from the FIG. 6 embodiment in that an automatic decision part 32 is placed in the handler HM. When the automatic turn-OFF part 26 automatically set unused the contacts having met the stop conditions, the automatic decision part 32 gains control from the automatic turn-OFF part 26, then counts the number of contacts set unused, and checks whether the count value is larger than a preset value; if not, the automatic decision part 32 automatically resets the resetting part 27 and controls the start-up part 28 to automatically restart the handler HM.

On the other hand, when the number of contacts set unused is larger than the preset value, the automatic decision part 32 controls a decision display 33 to provide thereon a display that urges the replacement of the contacts with new ones, while at the same time it holds the handler HM at a standstill.

Accordingly, the provision of the automatic decision part 32 permits automatic running of the handler HM until the time to replace the contacts with new ones and allows the operator to completely leave it to the automatic decision part 32 as to whether to replace the contacts.

Figure 9:
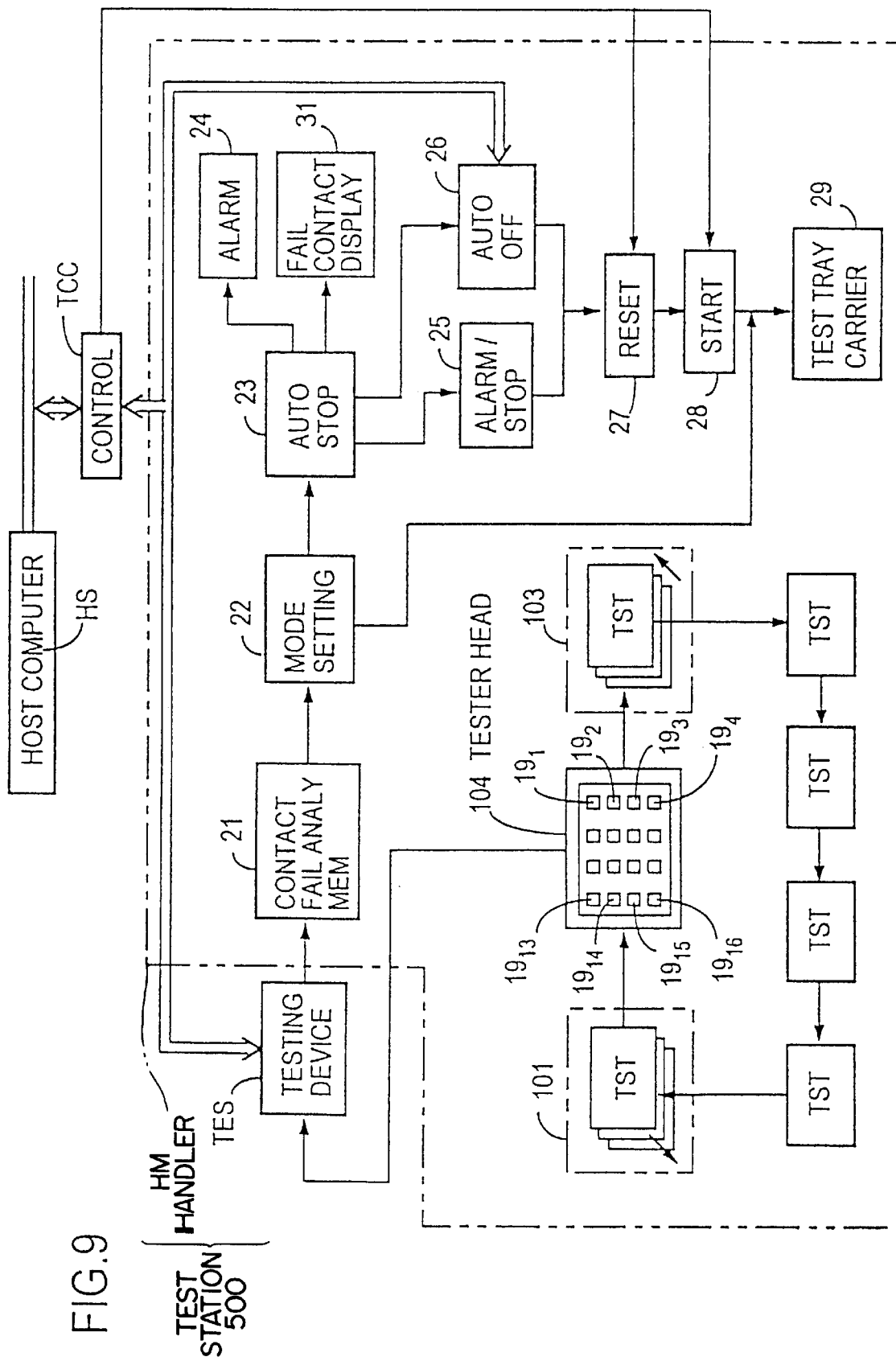
FIG. 9 is a block diagram illustrating still another embodiment of the present invention.

FIG. 9 illustrates in block form still another embodiment of the present invention. In this embodiment a controller TCC (used in the prior art), which controls data exchanges between a test station 500 formed by a combination of the handler HM with the testing device TES and a host computer HS, is equipped with the function of deciding whether or not the contacts are to be replaced. That is, as is the case with the prior art, the controller TCC is connected to the testing device TES via a bus line and sends data representative of the IC test situation in the testing device TES to the host computer ES to inform it of the test situation in each test station (many test stations being provided).

In the host computer HS there are stored test pattern generation programs corresponding to the kinds of ICs to be tested in the respective test stations. At the start of the test the host computer HS sends to the testing device TES of each test station the test pattern generation program corresponding to the kind of ICs to be tested therein so that the testing device TES generates the required test pattern. Conventionally, the controller TCC is employed to control data exchanges between each test station and the host computer TES and the transmission of the test pattern generation program from the latter to the former as described above, but in the present invention the controller TCC is equipped with the function of deciding whether or not the contacts are replaced with new ones. To this end, the controller TCC and the automatic turn-OFF part 26 are connected so that data can be exchanged therebetween and the controller TCC is further connected to the resetting part 27 and the start-up part 28 to provide thereto the decision result from the former. When the controller TCC decides that the contacts are not replaced, the resetting part 27 is turned OFF and the start-up part 28 is actuated to restart the handler HM.

EFFECT OF THE INVENTION

As described above, according to the present invention, the IC tester counts the number of times an IC failure occurs at each contact and, when the count value continuously increases in excess of a predetermined value, decides the contact as defective and inhibits the feeding thereto of ICs after that. As described previously with reference to the FIG. 6 embodiment, when the contact satisfies any one of the stop conditions, the handler HM automatically stops and, at the same time, the contact is set as being unused; hence, the operator needs only to perform operations for putting out the handler HM from its standstill state and for restarting it and is not required to the operation for putting the contact to the unused state—this appreciably reduces the operator's workload.

Furthermore, upon each automatic stop of the handler HM, the number of contacts set unused is displayed for visual recognition by the operator, enabling him to decide whether or not the contacts need to be replaced with new ones.

Accordingly, there is no possibility of the operator allowing the test to continue without noticing that more than half of the contacts are set unused as often experienced in the prior art method that merely detects contact failures and automatically puts the contacts concerned in the unused state.

Besides, by automatically deciding whether to replace the contacts as in the embodiments of FIGS. 8 and 9, the operator's workload is substantially reduced and the costs for IC testing can be sharply cut.

It will be apparent that many modifications and variations may be effected without departing from the scope of the novel concepts of the present invention.

What is claimed is:

1. An integrated-circuit tester comprising:
 a handler for automatically transferring plural ICs under test;
 a tester head mounted on said handler;
 plural contacts mounted on said tester head, for electric connections to said plural ICs;
 a testing device electrically connected to said tester head to actuate said plural ICs, for deciding whether they are non-defective or defective;
 contact failure analysis/storage means for counting the numbers of times when ICs tested in contact with each of said plural contacts are decided by said testing device as defective and for storing failure count values thus counted in correspondence with each of said plural contacts, respectively;
 automatic stop means for stopping said handler from operation when it determines a stop condition preset therein for stopping the handler is met in accordance with the failure count values for the respective contacts stored in said contact failure analysis/storage means; and
 automatic turn-OFF means, when said automatic stop means controls said handler to stop its operation, for setting the feeding of ICs to be inhibited to such failing contacts as having met the stop condition for stopping said handler, and for automatically putting said failing contacts out of use.

2. The tester of claim 1, further comprising automatic decision means coupled to said automatic turn-OFF means for deciding whether or not said plural contacts are to be replaced when total number of the failing contacts put out of use by said automatic turn-OFF means does or does not exceed a predetermined value.

3. The tester of claim 1, further comprising a failing contact display responsive to said automatic stop means for displaying respective identifiable numbers of the failing contacts put out of use, alarm means for raising and alarm when said automatic stop means controls said handler to top its operation, reset means manually operable by operator for resetting said automatic stop means and said alarm means, and start-up means manually operable by operator for starting up said handler.

4. The tester of claim 1, further comprising control means coupled through a bus to a host computer, for controlling data exchanges therethrough between said tester and said host computer, said control means being further coupled to said automatic turn-OFF means and deciding whether or not said plural contacts are to be replaced when the total number of the failing contacts put out of use by said automatic turn-OFF means does or does not exceed predetermined value.

5. A handler of an integrated-circuit tester comprising:
   a contact failure analysis memory storing failure count values corresponding to respective contacts of the integrated-circuit tester;
   a mode setting part, coupled to the contact failure analysis memory, setting automatic stop conditions for each of the respective contacts; and
   an automatic stop part stopping the operation of the handler based on the automatic stop values and the failure count values for each of the respective contacts, and transmitting either a signal indicating that the handler should be stopped and an alarm should be sounded, or a signal indicating that one of the contacts having met the automatic stop conditions should be put out of use.

6. The tester of claim 2, further comprising:
   a failing contact display responsive to said automatic stop means for displaying respective identifiable numbers of the failing contacts put out of use;
   alarm means for raising an alarm when said automatic stop means stops said handler;
   reset means for resetting said automatic stop means and said alarm means; and
   start-up means for starting up said handler,
   wherein said reset means and said start-up means are automatically actuated by said automatic decision means when it decides the contact are not to be replaced.

7. The tester according to claim 4,
   wherein said handler further comprises:
   reset means for resetting said automatic stop means; and
   start-up means for starting up said handler, and
   wherein said reset means and said start-up means are automatically actuated by said control means when it decides the contacts are not to be replaced.

* * * * *

UNITED STATES PATENT AND TRADEMARK OFFICE
CERTIFICATE OF CORRECTION

PATENT NO.    : 6,198,273 B1
DATED         : March 6, 2001
INVENTOR(S)   : Takeshi Onishi, et al.

It is certified that error appears in the above-identified patent and that said Letters Patent is hereby corrected as shown below:

Column 5,
Line 48, after "25" insert -- , --.

Column 6,
Line 55, change "Or" to -- or --.

Column 7,
Line 39, change "ES" to -- HS --.
Line 50, change "TES" to -- HS --.

Column 8,
Line 4, change "any" to -- predetermined --.

Signed and Sealed this

Thirtieth Day of October, 2001

Attest:

NICHOLAS P. GODICI
*Attesting Officer*     *Acting Director of the United States Patent and Trademark Office*